(12) United States Patent
Ottens et al.

(10) Patent No.: US 7,019,820 B2
(45) Date of Patent: Mar. 28, 2006

(54) LITHOGRAPHIC APPARATUS AND DEVICE MANUFACTURING METHOD

(75) Inventors: Joost Jeroen Ottens, Veldhoven (NL); Koen Jacobus Johannes Maria Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/735,848

(22) Filed: Dec. 16, 2003

(65) Prior Publication Data

US 2005/0128444 A1 Jun. 16, 2005

(51) Int. Cl.
G03B 27/62 (2006.01)
G03B 27/58 (2006.01)

(52) U.S. Cl. .......................... 355/75; 355/72
(58) Field of Classification Search .................. 355/53, 355/72–76; 361/234; 310/10, 12; 378/34, 378/35
See application file for complete search history.

(56) References Cited

U.S. PATENT DOCUMENTS

| | | | |
|---|---|---|---|
| 5,777,838 A * | 7/1998 | Tamagawa et al. | 361/234 |
| 6,033,478 A * | 3/2000 | Kholodenko | 118/500 |
| 6,608,745 B1 * | 8/2003 | Tsuruta et al. | 361/234 |
| 6,628,503 B1 * | 9/2003 | Sogard | 361/324 |
| 6,710,857 B1 * | 3/2004 | Kondo | 355/72 |
| 2005/0041364 A1 * | 2/2005 | Kellerman et al. | 361/234 |

FOREIGN PATENT DOCUMENTS

| | | | |
|---|---|---|---|
| EP | 0947884 A2 * | 6/1999 | |
| EP | 0 947 884 A2 | 10/1999 | |
| EP | 0 947 884 A3 | 7/2001 | |
| EP | 1 241 706 A2 | 9/2002 | |
| EP | 1 241 706 A3 | 2/2004 | |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus includes an illumination system for providing a beam of radiation and an article support for supporting an article to be placed in a beam path of the beam of radiation on the article support. The article support has a plurality of supporting protrusions. The plurality of protrusions define a support zone for providing a flat plane of support. A backfill gas feed is arranged in the support zone for providing a backfill gas flow to a backside of the article when supported by the article support, for providing an improved thermal conduction between the article and the article support. According to one aspect of the invention, the support zone is surrounded by a boundary zone having a reduced height relative to the plane of support so that the backfill gas flow is not bounded to the support zone.

13 Claims, 4 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a conventional lithographic projection apparatus, during photolithographic processes, an article, such as a wafer or reticle is clamped on an article support by a clamping force, that may range from vacuum pressure forces, electrostatic forces, intermolecular binding forces or just gravity force. The article support defines a plane, in the form of a plurality of protrusions defining an even flat surface on which the wafer or reticle is held. Tiny variations in the height of these protrusions are detrimental to image resolution, since a small deflection of the article from an ideal plane orientation may result in rotation of the wafer and a resulting overlay error due to this rotation. In addition, such height variations of the article support may result in height variation of the article that is supported thereby. During the lithographic process, such height variations may affect image resolution due to a limited focal distance of the projection system. Therefore, the article support may be flat.

European patent application EP0947884 describes a lithographic apparatus having a substrate holder wherein protrusions are arranged to improve the flatness of the substrate. These protrusions have a general diameter of 0.5 mm and are located generally at a distance of 3 mm away from each other and thereby form a bed of supporting members that support the substrate. For an electrostatic clamp, typically, the height of the protrusions lies in the range 1 mu m–15 mu m. Due to the relative large spaces in between the protrusions, contaminations possibly present generally do not form an obstruction for the flatness of the substrate, since these will be lying in between the protrusions and will not lift the substrate locally.

In the context of this application, the "article" may be any of the above mentioned terms wafer, reticle, mask, or substrate, more specifically terms such as: a substrate to be processed in manufacturing devices employing lithographic projection techniques; or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

In lithographic processing, passing of the projection beam through gas compositions present between the illumination system and the articles to be illuminated, in particular non-homogenous gas compositions, may cause undesired effects such as diffraction, refraction and absorption. These effects may have an adverse effect on illumination quality, in particular on a suitable resolution to be reached for the ever increasing demand in imaging performance. A new generation of lithography, the EUV-lithography, which uses a projection beam in the Extreme Ultra Violet area, therefore operates in or near vacuum conditions in order to allow the projection beam of radiation to pass substantially unhindered to the article to be placed in the beam. In this context, the term vacuum pressure is relative to particular gasses that are present in the environment. For instance, for carbonhydrogens and water, the allowable background pressure is very low, in the order of 1e–9–1e–12 millibar. For inert gasses the requirements are less strict, for instance, for Ar an allowable background pressure ranges from 1e–4 mbar–1e–2 mbar, in particular, a pressure of 1e–3 mbar. Also, the relative background pressure may vary in terms of the environment of the apparatus. For instance, where the article support functions in the environment of a wafer support, the vacuum requirements for certain components may be less strict than in the environment where the article support functions as a reticle support. That is, the partial pressures for contaminants (such as CxHy and H2O) may differ a factor 100 between optics compartment (including reticle support) and wafer compartment and are much lower than the total pressure (typical numbers are 1e–9 to 1e–12 mbar).

This vacuum technology offers challenges in terms of temperature control. For the article support of the preamble, only a very small part (ranging from 0.1 to 3% of a total area) of the bottom side of the article actually makes physical contact with the article support when supported thereby, since the protrusions are shaped to provide only a very small contact area and the protrusions are furthermore arranged spaced relatively wide apart. In the vacuum pressure ranges that are used, thermal conductivity is substantially proportional to the pressure, which means that the thermal energy absorbed by the article when placed in the projection beam can no longer adequately be diverted, so that unwanted thermal heating of the article supports, leading to thermal expansion and resulting projection inaccuracies or potentially to even the loss of the article. To overcome this problem, usually, use is made of a so-called back-fill gas, which offers a thermal conduction from the article to the article support to divert the thermal energy absorbed by the article. Of course, the article support will further, if necessary, be provided with a cooling structure such as cooling ducts containing cooling media etc. However, to confine the back-fill gas to the bottom side of the article, a conventional approach is providing a so-called "hard rim", which is a boundary wall substantially sealing of the backfill gas from the vacuum by forming a gas seal between the bottom side of the article and the upper side of the article support. A hard rim type article support is for instance known from European patent serial number EP1241706.

It has been found, however, that, in terms of illumination performance, such a hard rim causes problems. For an article such as a substrate at wafer level or a reticle in a reticle stage, the rim may result in an estimated deflection of 75 nm, causing a deteriorated image resolution. The presence of a sealing rim provides additional support to carry the article. Such additional support disturbs the pressure load of the article, which may cause local bending of the article. Such bending introduces rotation of the article surface, which may cause overlay effects that are undesired. Furthermore, a sealing rim provides almost a doubling of increase of contact area between the article and article support. This is undesirable since it is an aim to minimize such contact area in order to prevent contamination particles to come in between the contact zones, creating unevenness of support and corresponding bending problems of the article.

Furthermore, the presence of such a hard rim defines a definite outer area of the article where no backfill gas is present to provide thermal conductivity. This may cause further problems in terms of local overheating or undesired temperature gradients in the article.

SUMMARY

One aspect of the invention is to provide a lithographic apparatus where the above mentioned problems are overcome and wherein a backfill gas supply is provided which does not suffer from the above mentioned drawbacks.

One aspect of the invention provides a lithographic apparatus according to the features of claim 1. According to one aspect of the invention, the article can be kept in an improved level condition because the boundary zone is not in contact with the article, thus resulting in flatness variations significantly lower than the above indicated 75 nm.

Further, generally, in hard rim configurations, the article extends beyond the hard rim. Hence, in such configurations, in a boundary zone of the article, no thermal conductivity is provided due to the absence of backfill gas. In one embodiment of the invention, even in the reduced backfill gas pressure zone, outside the enclosed area, thermal conductivity is provided which provides improved thermal conductivity in the boundary zone of the article.

According to one aspect of the invention, the boundary zone comprises a boundary wall defining a boundary wall height that lies below the plane of support. In a preferred embodiment, the boundary wall defines a gap of more than 50 nm, in particular, more than 100 nm. In a particularly preferred embodiment, the boundary zone does not comprise a boundary wall. Although counter intuitive, the inventors of this application have found that for a conventional protrusion height of 5 mu m, in an optimized configuration, the leaking seal may be altogether absent, resulting in a leaking rate of 1 mbar*l/s, which is acceptable for a wafer stage.

Hence it follows that the hard rim seal configuration can be dispensed with, resulting in better leveling properties of the article support. In some designs, it may be beneficial to have some sort of seal, in particular a "non-contact" seal, or "leaking" seal, forming an increased flow resistance to limit the gas flow and increase the gas pressure near the boundary of the article. Therefore, preferably, the boundary zone comprises a boundary wall defining a boundary wall height that lies below the plane of support. This embodiment works particularly well where the backfill gas is an inert gas, such as Argon.

For these kind of gasses, in an embodiment using an electrostatic clamp, the allowable background pressure of the vacuum surrounding is relative high and a leaking rate of less than 1 mbar*l/s, in particular 0.15 mbar*l/s, is acceptable for Argon as a backfill gas, depending on the relative position of the article support. In the absence of a sealing boundary, the leaking rate was calculated to be 0.12 mbar*l/s, which was found to be within the above indicated upper limit. In a preferred embodiment, the calculated leak rate was 3e–3 mbar*l/s, which is far within above maximum specification. These values are for an applied background pressure of 1e–3 mbar. When the background pressure of the vacuum environment is lower, the leaking rate will be lowered correspondingly.

The backfill gas configuration may be operated in any suitable pressure environment. In one embodiment, the backfill gas configuration is used in a lithographic apparatus according any of the above aspects, further comprising a vacuum pump system for providing a vacuum pressure for operating the lithographic apparatus in vacuum pressure conditions, the vacuum pump operating to eliminate backfill gas flowing from the backside of the article.

In such configuration, the vacuum pump, in particular, a vacuum turbo pump, is simply operated to remove the leaking backfill gas. Such removal is practiced efficiently if the vacuum pump system comprises a suction zone enclosing the support zone. In such a case, escaping back fill gas particles may be captured directly before possibly adversely affecting the illumination process. In an embodiment, the article is clamped on the article support by an electrostatic clamp. Another aspect of the invention relates to an article support structure according to the features of claim 11. Another aspect of the invention relates to the lithographic apparatus according to the features of claim 13.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
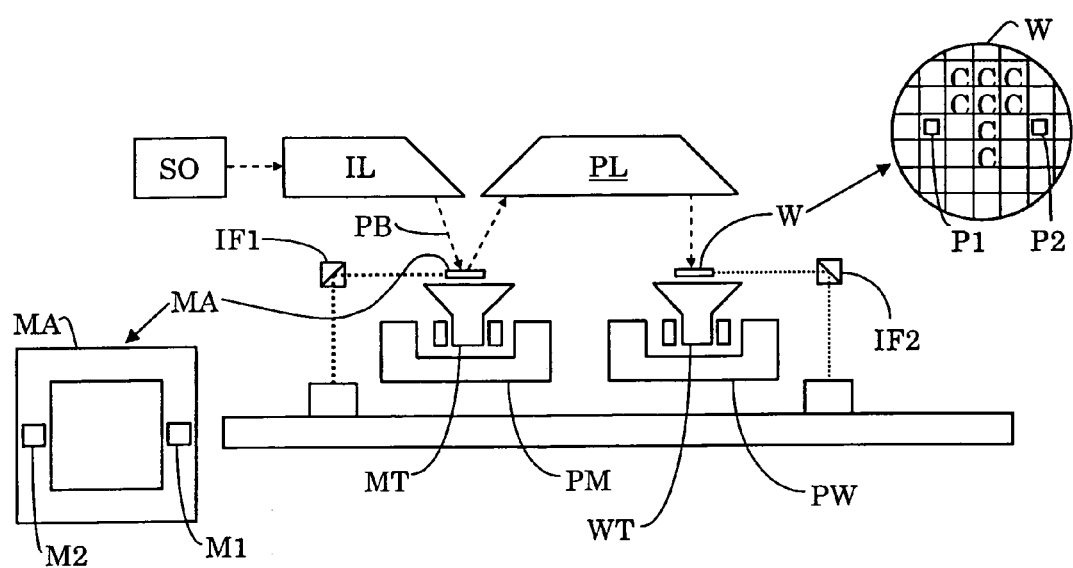
FIG. 1 depicts a lithographic apparatus according to an embodiment of the invention.

FIG. 1 schematically depicts a lithographic apparatus according to an embodiment of the invention. The apparatus comprises: an illumination system (illuminator) IL for providing a projection beam PB of radiation (e.g. UV or EUV radiation); a first support structure (e.g. a mask table) MT for supporting patterning device (e.g. a mask) MA and connected to first positioning structure PM for accurately positioning the patterning device with respect to item PL; a second support structure (e.g. a substrate table or wafer table) WT for holding a substrate (e.g. a resist-coated wafer) W and connected to second positioning structure PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjuster that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on a patterning device, illustrated in the form of the mask MA, which is held on the mask table MT. Being reflected by the mask MA, the projection beam PB passes through the lens PL, which focuses the beam onto a target portion C of the substrate W. With the aid of the second positioning structure PW and position sensor IF2 (e.g. an interferometric device), the substrate table WT can be moved accurately, e.g. so as to position different target portions C in the path of the beam PB. Similarly, the first positioning structure PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structure PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the de-magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
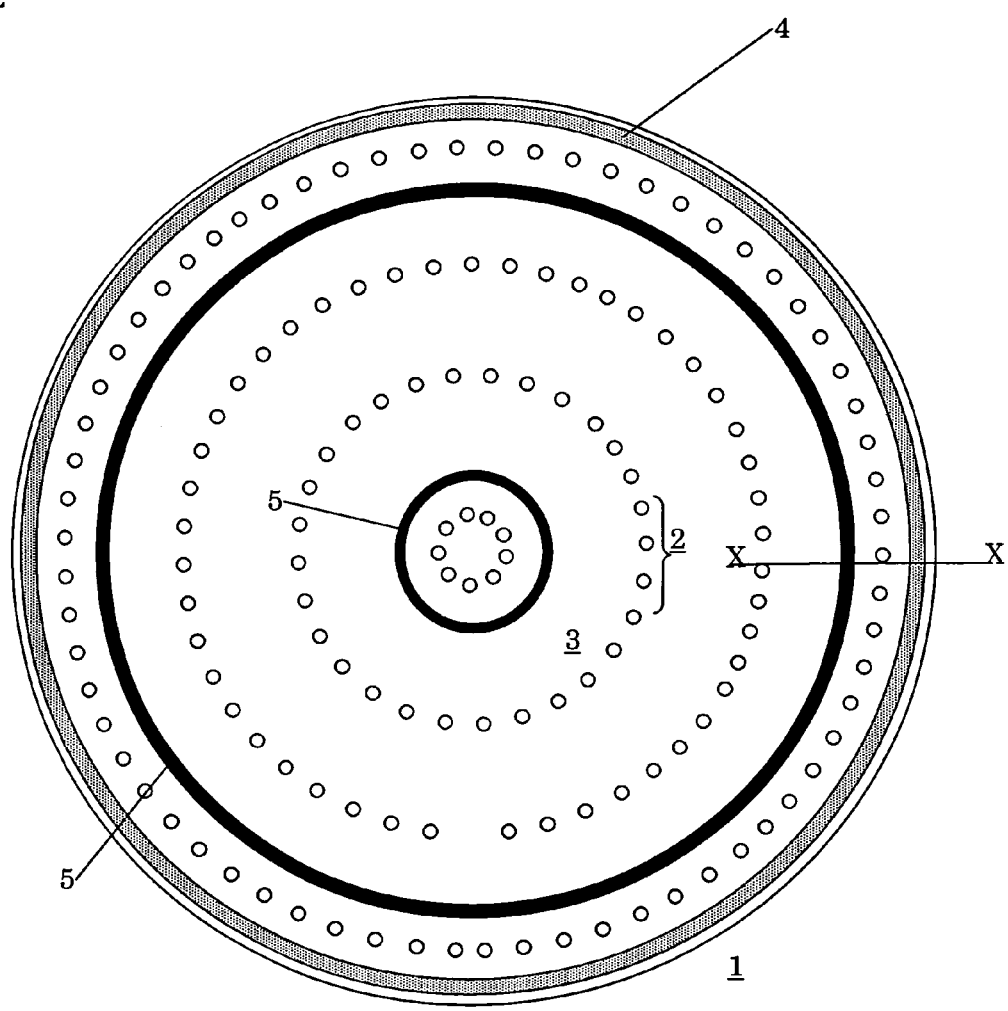
FIG. 2 depicts an embodiment of an article support according to an embodiment of the invention.

FIG. 2 depicts an article support 1. In this embodiment, the article support 1 is for supporting a wafer, shortly to be called wafer support table, and generally circular in form, which shape is common for wafer support tables. However, the article support may also be of another shape, in particular, a square shape. The wafer support table 1 comprises a plurality of protrusions 2 that are dimensioned to provide a flat support for supporting a wafer (not shown in FIG. 2). For clarity's sake, only a few protrusions 2 are referenced; generally, in the drawings they are indicated by open circles. The protrusions 2 thereby define a support zone 3. The boundary of the support zone 3 is formed by a surrounding wall 4, which may form a seal for confining backfill gas (not shown) within the support zone 3. In the wafer support table 1 of FIG. 2, backfill gas is introduced via gas feeds 5 which are located at selected positions. In the shown embodiment, the feeds are channel shaped; other forms are also used commonly. In a conventional embodiment, the surrounding wall 4 would be of the same height as the supporting protrusions 2 and thereby forms a so-called "hard-rim" supporting element for also supporting the wafer. This type of support is indicated as a "hard-rim" seal since the boundary wall 4 physically contacts the wafer during sealing and presses the bottom side thereof This causes the wafer to deform and unevenness is introduced in the support of the wafer, so that the wafer surface to be irradiated is not perfectly flat.

According to one embodiment of the invention, as follows from FIG. 3, the supporting zone 3 is not bounded by a hard-rim seal but by a boundary zone 4 having a reduced height relative to the plane of support 20 so that the backfill gas flow is not bounded to the support zone 3. Thus, the backfill gas is permitted to exit the support zone 3. In this way, the boundary zone 4 indicated in FIG. 3 forms a "leaking seal" 4. The distance between the top of the leaking seal 4 and the plane of support 20 form a gap 22 through which backfill gas may flow. This leaking seal 4 may be absent, provided that the flow characteristics of the backfill gas pressure, in relation to the feed positions is such that a sufficient pressure can be built up in the presence of the ambient pressure, which is often a vacuum pressure.

Figure 3:
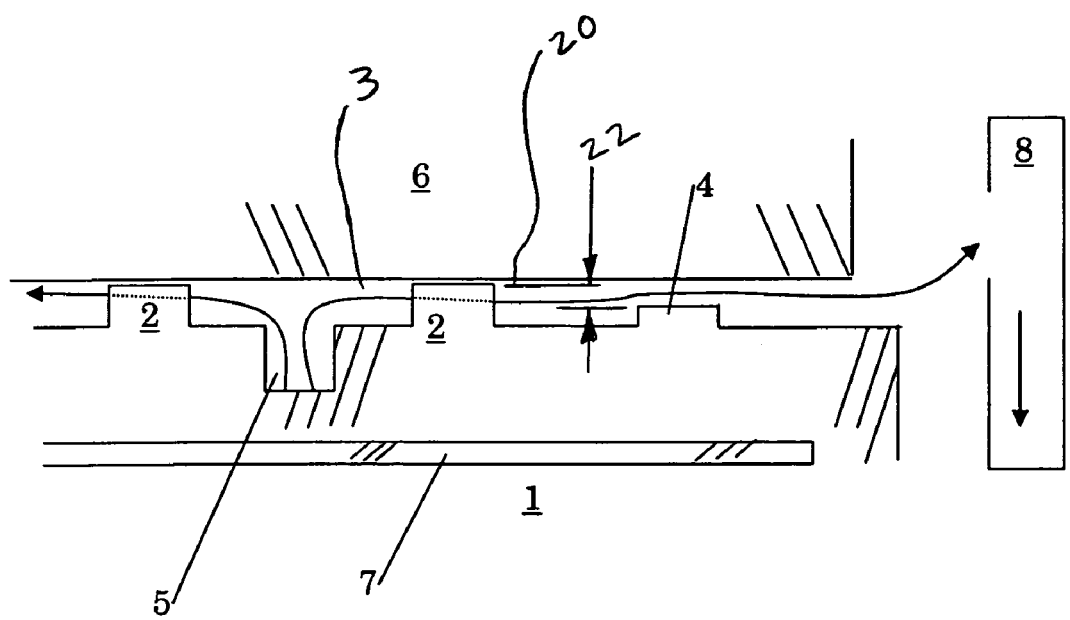
FIG. 3 depicts a side view of the article support according to FIG. 2 taken along the line X—X.

FIG. 3 shows a schematic height map of the article support 1 along the lines X—X depicted in FIG. 2. A wafer 6 is positioned on top of the protrusions 2 (for clarity's sake, FIG. 3 is depicted with a slight clearance between the wafer 6 and the protrusions 2) and clamped by an electrostatic clamp 7. The height of the protrusions 2 is a conventional height of approximately 5 mu m, whereas the leaking seal 4 is lowered with respect to that height by an amount of 0.1–5 mu m. It is noted that in an optimized configuration, the leaking seal 4 may be altogether absent.

Directly outside of the wafer support, a suction pump 8 may be present to trap outflowing gas.

Figure 4:
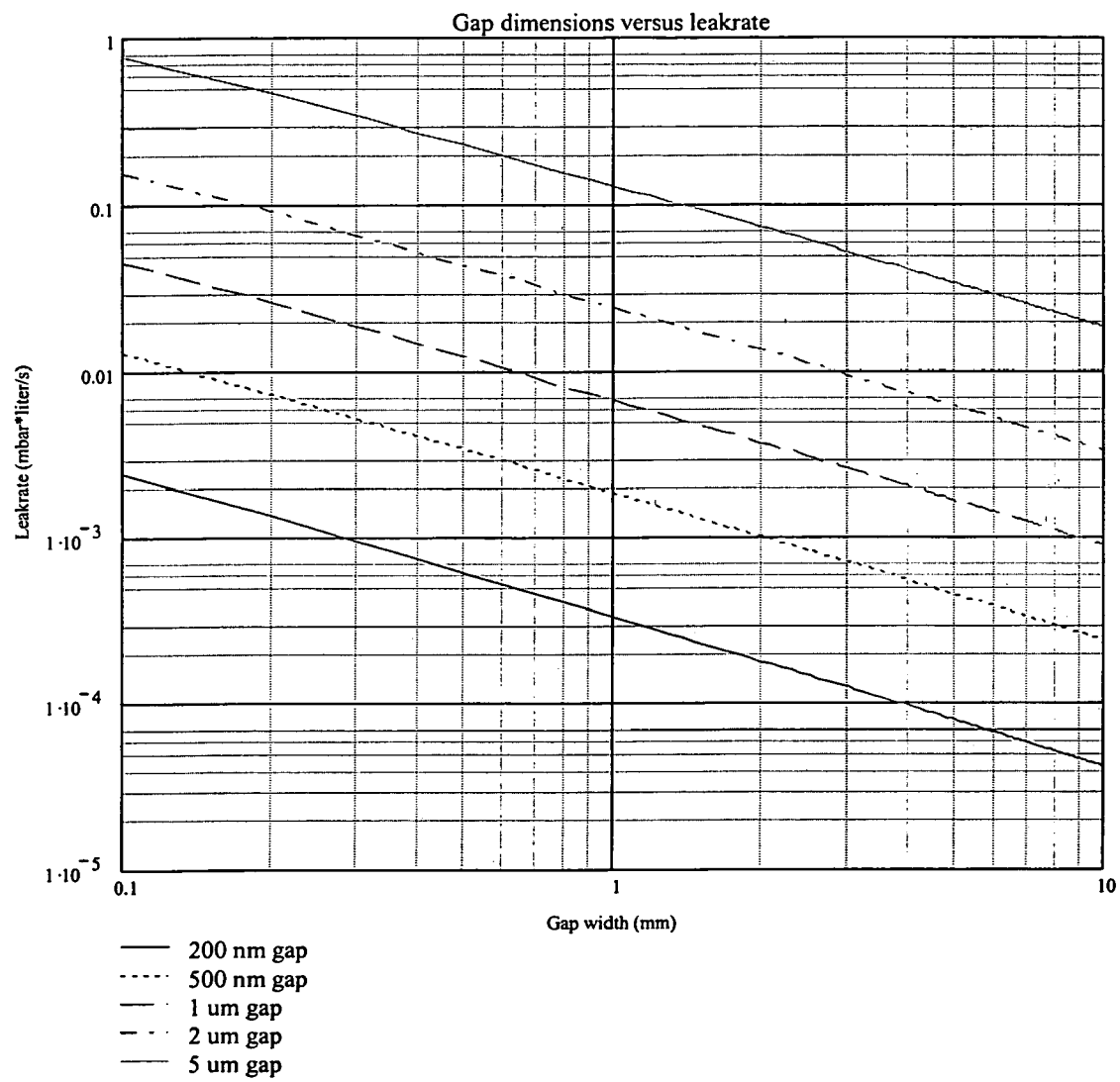
FIG. 4 illustrates a calculated leak rate depending on the geometry of the boundary wall according to an embodiment of the invention.

FIG. 4 illustrates, according to an embodiment of the invention, the leak rates that are calculated depending on a particular geometry of the boundary wall 4 for a standard wafer having a circumference of 942 mm. This geometry comprises a boundary wall 4 that has a lowered seal (indicated as a "gap" 22) of 200; 500; 1000; 2000 and 5000 nm. As expected the leak rate increases with the gap width, which corresponds to the distance of the boundary wall 4 to the gas supply feed 5, so that the lowest line in the chart corresponds to the lowest value and the upper line in the chart corresponds to the highest value of the gap 22. Furthermore, the gap width, corresponding to the distance of the boundary wall 4 to the gas supply feed 5, ranges from 0.1 mm to 10 mm. It is shown that in the indicated ranges, the leaking rate, expressed in mbar*liters/second varies from 0.5 e–4 to close to 1. For realistic embodiments, preferably, the leakrate of the backfill gas into the stage compartment should be less than 1 mbar*liter/s, more preferably less than 0.1 mbar*liter/s, most preferably less than 1e–5 mbar*liter/s. For a gap 22 of 5 um and width of 1 mm, the leaking rate is about 0.12 mbar*l/s, well within the specified maximum leak rate. These values are for an applied (total) background pressure of about 1 e–3 mbar. Furthermore, the leakrate of the backfill gas into the stage compartment should be less than 0.01 mbar*liter/s, more preferably less than 1e–3 mbar*liter/s, most preferably less than 1e–7 mbar*liter/s.

Hence, when the outer gas supply 5 is more than one mm outside the edge, the gap 22 may be as much as 5 um. A preferred embodiment for a wafer comprised a gap 22 of 500 nm and 0.5 mm gap width, giving rise to a leakrate of 3e–3 mbar*l/s. For a reticle stage, such an embodiment comprises a gap width of 2 mm and a gap 22 of 200 nm for a total circumference of 1136 mm.

In the illustrated embodiment, the article support is substantially circular and is used for supporting a wafer to be illuminated by the projection beam. However, aspects of the invention may be applied to any other article, in particular, to an article in the form of a reticle. Furthermore, the article supports disclosed are electrostatically clamped. However, other types of clamping may be used, such as physical clamping, use of intermolecular binding forces or just gravity force alone.

While specific embodiments of the invention have been described above, it will be appreciated that aspects of the invention may be practiced otherwise than as described. The description is not intended to limit the aspects of the invention.

What is claimed is:

1. A lithographic apparatus comprising:
    an illumination system constructed to provide a beam of radiation;
    an article support structure constructed to support an article to be placed in a beam path of said beam of radiation on said article support structure, said article support structure having a plurality of supporting protrusions, said plurality of supporting protrusions defining a support zone to provide a plane of support; and
    a backfill gas feed arranged in said support zone to provide a backfill gas that flows to a backside of said article when supported by said article support structure, said backfill gas feed structured to provide an improved thermal conduction between said article and said article support structure;
    said support zone being surrounded by a boundary having a reduced height relative to said plane of support so that the flow of said backfill gas is permitted to exit said support zone.

2. A lithographic apparatus according to claim 1, wherein said article is substantially flat, and said plane of support is substantially flat.

3. A lithographic apparatus according to claim 1, wherein said boundary comprises a boundary wall defining a boundary wall height that lies below said plane of support.

4. A lithographic apparatus according to claim 3, wherein said boundary wall defines a gap between a top of said boundary wall and said plane of support, said gap having a height of more than 50 nm.

5. A lithographic apparatus according to claim 1, wherein said boundary does not include a boundary wall.

6. A lithographic apparatus according to claim 1, further comprising:
    a vacuum pump system to provide a vacuum pressure to operate said lithographic apparatus in vacuum pressure conditions, said vacuum pump system operating to eliminate backfill gas flowing from said backside of said article.

7. A lithographic apparatus according to claim 6, wherein said vacuum pump system includes a suction zone enclosing said support zone.

8. A lithographic apparatus according to claim 1, wherein said article is clamped on said article support structure by an electrostatic clamp.

9. A lithographic apparatus according to claim 1, wherein said article support structure is a support constructed to support a patterning device, said patterning device constructed to impart a cross-section of said beam of radiation with a pattern.

10. A lithographic apparatus according to claim 1, wherein said article support structure is a substrate table to hold a substrate to be patterned by said beam of radiation onto a target portion of said substrate.

11. An article support structure for a lithographic apparatus, comprising:
    a plurality of supporting protrusions, said plurality of protrusions defining a support zone and providing a plane of support to support an article; and
    a backfill gas feed constructed and arranged in said support zone to provide a flow of backfill gas to a backside of the article when supported by said plurality of supporting protrusions, to provide an improved thermal conduction between the article and said article support structure;
    said support zone being surrounded by a boundary having a reduced height relative to said plane of support so that said flow of backfill gas is permitted to exit said support zone.

12. An article support structure according to claim 11, wherein said plane of support is substantially flat.

13. A lithographic apparatus comprising:
    means for providing a beam of radiation;
    means for supporting an article to be placed in a beam path of said beam of radiation on said article support structure, said means for supporting defining a support zone;
    means for providing a flow of backfill gas in said support zone for providing improved thermal conduction between said article and said means for supporting said article; and
    means for surrounding said support zone so that said flow of backfill gas is permitted to exit said support zone.

* * * * *